United States Patent [19]

Neumann

[11] Patent Number: 4,721,911
[45] Date of Patent: Jan. 26, 1988

[54] NUCLEAR MAGNETIC RESONANCE TOMOGRAPHY APPARATUS

[75] Inventor: Helmut Neumann, Erlangen, Fed. Rep. of Germany

[73] Assignee: Siemens Aktiengesellschaft, Berlin and Munich, Fed. Rep. of Germany

[21] Appl. No.: 884,283

[22] Filed: Jul. 10, 1986

[30] Foreign Application Priority Data

Jul. 26, 1985 [DE] Fed. Rep. of Germany ....... 3526870

[51] Int. Cl.$^4$ .............................................. G01R 33/20
[52] U.S. Cl. ...................................... 324/309; 324/312
[58] Field of Search ........................ 324/309, 312, 307; 128/653; 382/6, 43

[56] References Cited

U.S. PATENT DOCUMENTS

| | | | |
|---|---|---|---|
| 4,068,161 | 1/1978 | Ernst | 324/312 X |
| 4,070,611 | 1/1978 | Ernst | |
| 4,355,282 | 10/1982 | Young et al. | 324/309 |
| 4,506,223 | 3/1985 | Bottomley et al. | 324/309 |
| 4,585,992 | 4/1986 | Maudsley et al. | 324/312 X |
| 4,616,182 | 10/1986 | Kramer et al. | 324/309 |
| 4,620,153 | 10/1986 | Hino | 324/309 X |
| 4,621,235 | 11/1986 | Van Uijen et al. | 324/309 X |
| 4,649,345 | 3/1987 | Yoda et al. | 324/309 |

FOREIGN PATENT DOCUMENTS 0132975 2/1985 European Pat. Off. .

Primary Examiner—Tom Noland
Attorney, Agent, or Firm—Hill, Van Santen, Steadman & Simpson

[57] ABSTRACT

A nuclear magnetic resonance tomography apparatus, and a method for operating such an apparatus, generate a tomographic image by projecting acquired signals corresponding to the nuclear spins on a frequency axis as a Fourier line, and the image of the examined slice is calculated by Fourier transformation of the Fourier lines. In the method and apparatus, a number of echo sequences are acquired after excitation of the nuclear spins in the axamination subject by a high frequency pulse. Each echo sequence consists of a selected number of individual echoes occurring in succession within each sequence. In the method and apparatus, entry of these individual echoes into a matrix having a central zero line is controlled such that the first-occuring echoes from each sequence are entered in the matrix on alternating sides of the zero line, i.e., above and below the zero line, at increasing distances from the zero line. After all of the first-occurring echoes have been entered, the same alternating entry format is undertaken for the second-occurring echoes in each sequence, and so on until all echoes from all sequences have been entered in the matrix.

2 Claims, 3 Drawing Figures

NUCLEAR MAGNETIC RESONANCE TOMOGRAPHY APPARATUS

BACKGROUND OF THE INVENTION

1. Field of the Invention

The present invention relates to tomography devices employing nuclear magnetic resonance for generating a tomographic image, and in particular to such devices wherein a projection of the nuclear spin is acquired on a frequency axis as a Fourier line and the image of the examined slice is calculated by Fourier transformation from the Fourier lines.

2. Related Application

The subject matter of the present application is related to the subject matter of co-pending application Ser. No. 865,998 filed May 22, 1986 (Zimmermann and Czygan) entitled "Nuclear Magnetic Resonance Tomography Apparatus," and assigned to the assignee of the present application.

3. Description of the Prior Art

Nuclear magnetic resonance tomography devices operate based on the known principle that the hydrogen nuclear spin of an examination subject can be deflected from a preferred or equilibrium direction, imposed by a fundamental magnetic field, by means of a high-frequency excitation pulse. At the conclusion of the excitation pulse, the nuclear spins require a certain relaxation time to return to the equilibrium position. During this time, the spins precess with a frequency which is dependent on the strength of the fundamental magnetic field. This precessional motion can be detected with an RF antenna and associated receiver circuits. By superimposing a first field gradient on the uniform fundamental magnetic field, so that the magnetic field distribution spatially varies, identification of the spatial orientation of the spin (the gradient direction) can be undertaken by analyzing the measured frequency.

It is also known, before the signals in the first gradient are read out, to undertake a locus coding along a second spatial axis by briefly applying a second gradient field with variable amplitude or variable time duration. The second gradient field is applied orthogonally to the first gradient field, and slice images of the examination subject can be produced in this manner. Excitation of the nuclear spins in the slice of the examination subject is achieved because the fundamental magnetic field is influenced by a third gradient field disposed perpendicularly with respect to both the first and second gradient fields. The influence on the fundamental field is such that excitation of the spin occurs only in the slice of interest. This is possible because the excitation occurs with a frequency which is strictly allocated to the slice of interest. This method is described, for example, in U.S. Pat. No. 4,070,611.

It is also known to conduct the signal generation and echo acquisition in a nuclear magnetic resonance device such that each acquired echo sequence consists of a defined number of echoes, which then requires organization of the echoes in a matrix in a suitable manner.

SUMMARY OF THE INVENTION

It is an object of the present invention to control organization or classification of the echoes in a measuring matrix such that a favorable signal-to-noise ratio is achieved within a short measuring time.

The above object is achieved in accordance with the principles of the method and apparatus described herein by using a control unit to control entry of the individual echoes within the echo sequences in the matrix such that the first echoes from each echo sequence are entered alternatingly above and below a center or zero line of the matrix, at increasing distances toward the opposite edges thereof. After all of the first-occurring echoes have been entered, the same procedure is undertaken for entering the second echoes of each sequence, until all individual echoes of all echo sequences are entered in the matrix.

In the context of generating a nuclear magnetic resonance tomograph, those Fourier lines which contain much of the information for the image to be produced are ordered or arranged in the center of the measuring matrix, and those lines which contain less information are arranged at the edge of the measuring matrix. Because the center of the measuring matrix contributes more to the image in the subsequent Fourier transformation than do the edges, a favorable signal-to-noise ratio is achieved within a relatively short measuring period.

DESCRIPTION OF THE PREFERRED EMBODIMENTS

Figure 1:
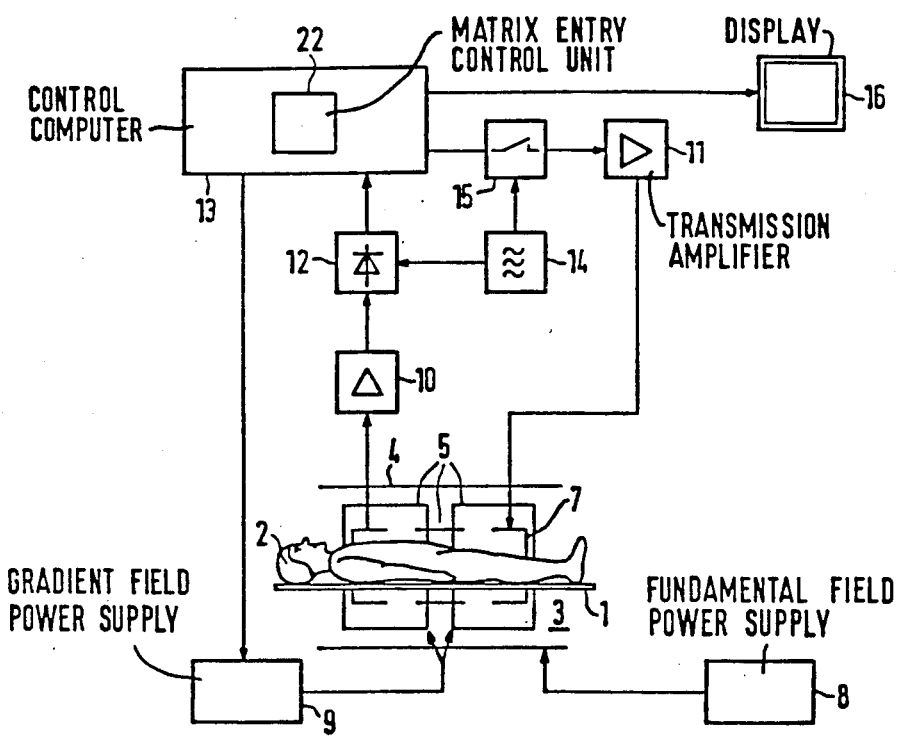
FIG. 1 is a schematic block diagram of a nuclear magnetic tomography apparatus constructed in accordance with the principles of the present invention.

A nuclear magnetic resonance tomography apparatus constructed in accordance with the principles of the present invention is shown in FIG. 1 having a support 1 on which an examination subject lies. Images of selected layers of the examination subject 2 are to be generated using the principles of nuclear magnetic resonance. For this purpose, a coil system 3 is provided including a coil 4 for generating a uniform fundamental magnetic field and gradient coils 5 for varying the fundamental magnetic field, and an excitation and measuring coil 7. The coil 4 is connected to a fundamental field power supply 8 and the gradient coils 5 are connected to a gradient field power supply 9. The excitation and measuring coil 7 is connected to a preamplifier 10 and, through suitable coupling elements, to a transmission amplifier 11. The measured signal which is the output of the pre-amplifier 10 is supplied through a phase-sensitive rectifier 12 to a process control computer 13 which controls the overall measuring procedure. The excitation pulse is generated by a high-frequency oscillator 14 which is connectible to the transmission amplifier 11 through a modulator 15. The images reconstructed from the measured signals are displayed on a monitor 16.

For the purpose of producing a slice image of the examination subject 2 disposed within the coil system 3, the spins in the slice of interest are first excited.

Figure 2:
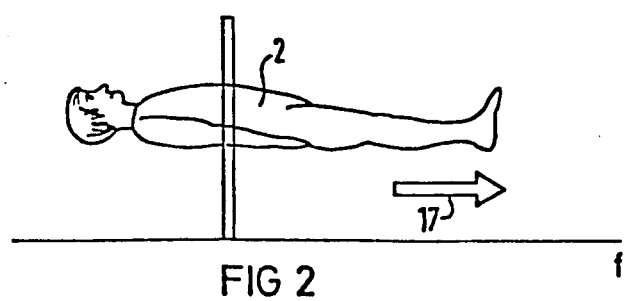
FIG. 2 is a schematic illustration showing the relative orientation of the patient, the tomographic slice of interest, and a fundamental field gradient in the apparatus of FIG. 1.

FIG. 2 schematically shows that the excited slice in the examination subject 2 is defined by the topical dependency or the flux density, and thus by the nuclear resonant frequency. The field gradient for the fundamental field is schematically shown in FIG. 2 referenced at 17. The resonant frequency is referenced f. An excitation of the spin only in the illustrated region of the examination subject 2 occurs.

After excitation, coding of the spin with respect to the second spatial axis is undertaken by applying a gradient of short duration in the second spatial direction, referred to below as the coding gradient. Subsequently the nuclear resonance signal is read in the form of a readout gradient, which defines the first spatial dimension. This step is repeated with coding gradients which have changed, for example, in steps from positive to negative. The nuclear resonance signals read out to a specific coding gradient amplitude are referred to as a Fourier projection.

Figure 3:
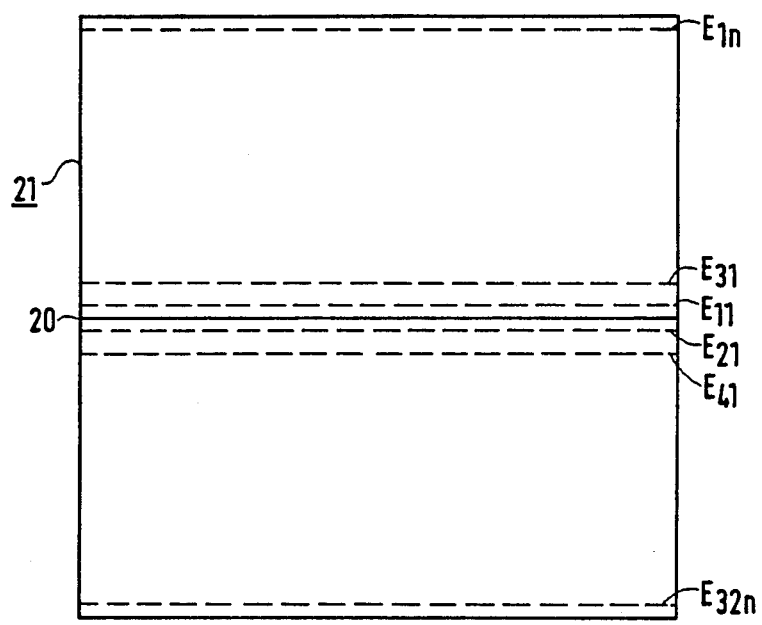
FIG. 3 is schematic illustration showing the sequence of entry of the Fourier lines in the measuring matrix in accordance with the principles of the present invention.

The measured signals corresponding to the successive Fourier projections correspond to parallel Fourier lines in a measuring matrix 21 shown in FIG. 3. The matrix 21 may, for example, be a part of the control computer 13. In practice, 256 Fourier lines, for example, can be provided for a complete measuring matrix. The zero Fourier line 20, which is associated with the coding gradient having a zero amplitude, is disposed in the middle of the measuring matrix 21 as shown in FIG. 3. An image of the examined layer can be calculated from the measured signals of the individual Fourier lines by undertaking a two-dimensional Fourier transformation according to rows and columns.

The measuring matrix 21 schematically represented in FIG. 3 shows the ordering or arrangement of the Fourier lines in accordance with the principles of the present method and apparatus. The entry of the echo signals into the measuring matrix 21 is controlled by a matrix entry control unit 22, which may be contained within the control computer 13. In the example schematically illustrated in FIG. 3, it has been assumed that thirty-two echo sequences $E_1$ through $E_{32}$ have been read out in the measuring procedure. Each echo sequence $E_1$ through $E_{32}$ in turn consists of a plurality n of individual echoes. The number n of such individual echoes may, for example, be 8. Accordingly, the echo sequence $E_1$ consists of individual echoes $E_{11}$ through $E_{1n}$, with n=1, 2, ... 8; the echo sequence $E_2$ consists of individual echoes $E_{21}$ through $E_{2n}$, and so on. The amplitude of the individual echoes becomes smaller with increasing n.

The control unit 22 controls entry of the individual echoes into the measuring matrix 21 as shown in FIG. 3 such that the first-occurring echoes $E_{11}$, $E_{21}$, $E_{31}$, $E_{41}$ and so on of each echo sequence are successively alternatingly entered above and below the zero Fourier line 20, i.e., alternatingly above and below the center of the measuring matrix 21 in increasing distances away from the zero line 20 moving closer to the respective opposite edges of the matrix 21. After all of the first-occurring individual echoes in each echo sequence have been entered in this manner, the second-occurring individual echoes $E_{12}$ through $E_{32\,2}$ of each echo sequence are entered into the matrix 21 in the same manner until finally the last-occurring echoes $E_1$ and through $E_{32n}$ in each sequence are entered closest to the edges of the measuring matrix 21. For clarity, only the ordering of the echoes $E_{11}$ through $E_{41}$ and $E_{1n}$ and $E_{32n}$ is shown in FIG. 3.

By entering the individual echoes as described above, a hologram is formed wherein a good signal-to-noise ratio is established given a short measuring time, because the centrally disposed Fourier lines contain the most topical information and thus have the greatest significance in reconstructing the tomograph image.

Although modifications and changes may be suggested by those skilled in the art it is the intention of the inventor to embody within the patent warranted hereon all changes and modifications as reasonably and properly come within the scope of his contribution to the art.

We claim as our invention:

1. A nuclear magnetic resonance tomography apparatus for generating an image of a selected layer of an examination subject comprising:

means for generating a fundamental magnetic field in which said examination subject is disposed;

means for generating a plurality of gradient fields for selectively varying said fundamental field;

excitation and measuring means for exciting nuclear spins in said selected layer of said examination subject and for acquiring a plurality of echo sequences each consisting of a selected plurality of successive echoes corresponding to said nuclear spins after excitation in the form of Fourier lines;

a measuring matrix having a central zero line and opposite edges spaced from said zero line for storing said Fourier lines for constructing said image; and means for controlling insertion of said Fourier lines into said measuring matrix such that the first of the successive echoes in each sequence are entered in said measuring matrix alternatingly above and below said zero line at respective increasing distances therefrom until all of the first of the successive echoes in each sequence have been entered, said means for controlling thereafter entering the next-successive echoes in each sequence alternatingly above and below said zero line until all of the successive echoes in all of the echo sequences have been entered in said measuring matrix.

2. A method for operating a nuclear magnetic resonance tomography apparatus for generating an image of a selected layer of an examination subject comprising the steps of:

generating a fundamental magnetic field in which said examination subject is disposed;

generating a plurality of gradient fields for selectively varying said fundamental field;

exciting nuclear spins in said selected layer of said examination subject;

acquiring a plurality of echo sequences each consisting of an identical number of individual successive echoes corresponding to said nuclear spins after excitation in the form of Fourier lines;

storing said Fourier lines in a measuring matrix having a central zero line and opposite edges spaced from said zero line for constructing said image;

entering said individual echoes in said measuring matrix in a selected order by first entering each of the first-occurring individual echoes in said echo sequences alternatingly above and below said zero line at respective increasing distances therefrom until all of the first-occurring individual echoes have been entered in said measuring matrix; and repeating the above step of entering for all of the next-occurring individual echoes in order until all of the individual echoes in all of the echo sequences have been entered in said matrix.

* * * * *